United States Patent
Reid et al.

(10) Patent No.: US 10,516,110 B2
(45) Date of Patent: Dec. 24, 2019

(54) FABRICATION OF CORRELATED ELECTRON MATERIAL DEVICES WITH REDUCED INTERFACIAL LAYER IMPEDANCE

(71) Applicant: ARM Ltd., Cambridge (GB)

(72) Inventors: Kimberly Gay Reid, Austin, TX (US); Lucian Shifren, San Jose, CA (US)

(73) Assignee: ARM Ltd., Cambridge (GB)

(*) Notice: Subject to any disclaimer, the term of this patent is extended or adjusted under 35 U.S.C. 154(b) by 11 days.

(21) Appl. No.: 15/207,708

(22) Filed: Jul. 12, 2016

(65) Prior Publication Data

US 2018/0019394 A1  Jan. 18, 2018

(51) Int. Cl.
| | | |
|---|---|---|
| H01L 49/00 | (2006.01) | |
| C23C 16/34 | (2006.01) | |
| H01L 45/00 | (2006.01) | |
| C23C 16/30 | (2006.01) | |
| C23C 16/56 | (2006.01) | |

(52) U.S. Cl.
CPC .......... *H01L 49/003* (2013.01); *C23C 16/308* (2013.01); *C23C 16/34* (2013.01); *C23C 16/56* (2013.01); *H01L 45/04* (2013.01); *H01L 45/1233* (2013.01); *H01L 45/1253* (2013.01); *H01L 45/146* (2013.01); *H01L 45/16* (2013.01); *H01L 45/1641* (2013.01)

(58) Field of Classification Search
None
See application file for complete search history.

(56) References Cited

U.S. PATENT DOCUMENTS

| | | | |
|---|---|---|---|
| 5,279,857 A | | 1/1994 | Eichman et al. |
| 5,939,131 A | * | 8/1999 | Kim .................. H01L 28/40 257/E21.008 |
| 7,298,640 B2 | | 11/2007 | Chen et al. |
| 7,639,523 B2 | | 12/2009 | Celinska et al. |
| 7,778,063 B2 | | 8/2010 | Brubaker et al. |
| 7,872,900 B2 | | 1/2011 | Paz De Araujo et al. |
| 8,569,172 B1 | | 10/2013 | Jo et al. |
| 9,558,819 B1 | | 1/2017 | Aitken et al. |
| 9,584,118 B1 | | 2/2017 | Dao et al. |
| 9,589,636 B1 | | 3/2017 | Bhavnagarwala et al. |

(Continued)

FOREIGN PATENT DOCUMENTS

| | | |
|---|---|---|
| JP | 2012104719 A | 5/2012 |
| WO | 2009114796 A1 | 9/2009 |
| WO | 2009140305 A1 | 11/2009 |

OTHER PUBLICATIONS

Notification of Transmittal of the International Search Report and the Written Opinion of the International Searching Authority, or the Declaration, App. No. PCT/GB2017/051977, dated Sep. 22, 2017, 17 Pages.

*Primary Examiner* — Fazli Erdem
*Assistant Examiner* — Scott R Wilson
(74) *Attorney, Agent, or Firm* — Berkeley Law & Technology Group, LLP

(57) ABSTRACT

Subject matter disclosed herein may relate to fabrication of correlated electron materials used, for example, to perform a switching function. In embodiments, processes are described, which may be useful in avoiding formation of a potentially resistive oxide layer at an interfacial surface between a conductive substrate, for example, and a correlated electron material.

12 Claims, 7 Drawing Sheets

(56) References Cited

U.S. PATENT DOCUMENTS

| | | |
|---|---|---|
| 9,627,615 B1 | 4/2017 | Reid et al. |
| 9,997,702 B2 | 6/2018 | Reid et al. |
| 2003/0213987 A1* | 11/2003 | Basceri ............... H01L 21/3141 257/296 |
| 2008/0106926 A1 | 5/2008 | Brubaker |
| 2008/0107801 A1 | 5/2008 | Celinska et al. |
| 2009/0272962 A1* | 11/2009 | Kumar .................... H01L 45/08 257/4 |
| 2012/0153275 A1* | 6/2012 | Endo ................... H01L 27/1225 257/43 |
| 2013/0200323 A1 | 8/2013 | Pham et al. |
| 2013/0214232 A1 | 8/2013 | Tendulkar et al. |
| 2013/0221307 A1* | 8/2013 | Wang ..................... H01L 45/10 257/2 |
| 2013/0285699 A1 | 10/2013 | McWilliams et al. |
| 2014/0192589 A1* | 7/2014 | Maxwell ............... H01L 45/085 365/148 |
| 2016/0163978 A1 | 6/2016 | Paz De Araujo et al. |
| 2017/0033782 A1 | 2/2017 | Shifren et al. |
| 2017/0045905 A1 | 2/2017 | Sandhu et al. |
| 2017/0047116 A1 | 2/2017 | Sandhu et al. |
| 2017/0047919 A1 | 2/2017 | Sandhu et al. |
| 2017/0069378 A1 | 3/2017 | Shifren et al. |
| 2017/0213960 A1 | 7/2017 | Paz De Araujo et al. |
| 2017/0237001 A1 | 8/2017 | Reid et al. |
| 2017/0301859 A1 | 10/2017 | Paz De Araujo et al. |
| 2018/0013062 A1 | 1/2018 | Reid et al. |
| 2018/0019394 A1 | 1/2018 | Reid et al. |
| 2018/0053892 A1 | 2/2018 | Reid et al. |
| 2018/0096713 A1 | 4/2018 | Chandra et al. |
| 2018/0159028 A1 | 6/2018 | Shifren et al. |
| 2018/0159029 A1 | 6/2018 | Paz De Araujo et al. |
| 2018/0159031 A1 | 6/2018 | Paz De Araujo et al. |
| 2018/0175290 A1 | 6/2018 | Reid et al. |

* cited by examiner

FABRICATION OF CORRELATED ELECTRON MATERIAL DEVICES WITH REDUCED INTERFACIAL LAYER IMPEDANCE

BACKGROUND

Field

This disclosure relates to correlated electron devices, and may relate, more particularly, to approaches toward fabricating correlated electron devices, such as may be used in switches, memory circuits, and so forth, exhibiting desirable impedance characteristics.

Information

Integrated circuit devices, such as electronic switching devices, for example, may be found in a wide range of electronic device types. For example, memory and/or logic devices may incorporate electronic switches suitable for use in computers, digital cameras, cellular telephones, tablet devices, personal digital assistants, and so forth. Factors related to electronic switching devices, which may be of interest to a designer in considering whether an electronic switching device is suitable for a particular application, may include physical size, storage density, operating voltages, impedance ranges, and/or power consumption, for example. Other factors that may be of interest to designers may include, for example, cost of manufacture, ease of manufacture, scalability, and/or reliability. Moreover, there appears to be an ever-increasing need for memory and/or logic devices that exhibit characteristics of lower power and/or higher speed.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1A:
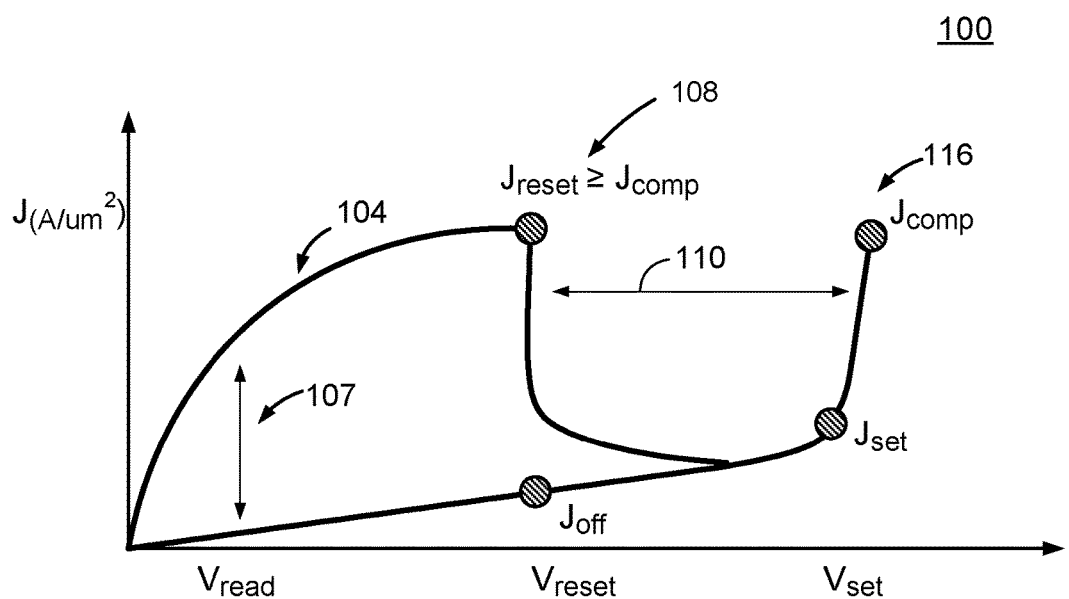
FIG. 1A is an illustration of an embodiment of a current density versus voltage profile of a device formed from a correlated electron material.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe methods and/or processes for preparing and/or fabricating correlated electron materials (CEMs) to form, for example, a correlated electron switch, such as may be utilized to form a correlated electron random access memory (CERAM) in memory and/or logic devices, for example. Correlated electron materials, which may be utilized in the construction of CERAM devices and CEM switches, for example, may also comprise a wide range of other electronic circuit types, such as, for example, memory controllers, memory arrays, filter circuits, data converters, optical instruments, phase locked loop circuits, microwave and millimeter wave transceivers, and so forth, although claimed subject matter is not limited in scope in these respects. In this context, a CEM switch may exhibit a substantially rapid conductor-to-insulator transition, which may be brought about by electron correlations rather than solid state structural phase changes, such as in response to a change from a crystalline to an amorphous state, for example, in a phase change memory device or, in another example, formation of filaments in resistive RAM devices. In one aspect, a substantially rapid conductor-to-insulator transition in a CEM device may be responsive to a quantum mechanical phenomenon, in contrast to melting/solidification or filament formation, for example, in phase change and resistive RAM devices. Such quantum mechanical transitions between relatively conductive and relatively insulative states, and/or between first and second impedance states, for example, in a CEM may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a relatively "insulative/higher impedance state."

In an aspect, a quantum mechanical transition of a correlated electron material between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may switch from a relatively insulative/higher impedance state to a relatively conductive/lower impedance state if a Mott transition condition occurs. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

Further, in an embodiment, switching from a relatively insulative/higher impedance state to a substantially dissimilar and relatively conductive/lower impedance state may bring about a change in capacitance in addition to a change in resistance. For example, a CEM device may exhibit a variable resistance together with a property of variable capacitance. In other words, impedance characteristics of a CEM device may include both resistive and capacitive components. For example, in a metal state, a CEM device may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of the CEM comprising a device. In an embodiment, a CEM may form a "bulk switch." As used herein, the term "bulk switch" refers to at least a majority volume of a CEM switching a device's impedance state, such as in response to a Mott-transition. For example, in an embodiment, substantially all CEM of a device may switch from a relatively insulative/higher impedance state to a relatively conductive/lower impedance state or from a relatively conductive/lower impedance state to a relatively insulative/higher impedance state responsive to a Mott-transition. In an embodiment, a CEM may comprise one or more transition metals, or more transition metal compounds, one or more transition metal oxides (TMOs), one or more oxides comprising rare earth elements, one or more oxides of one or more f-block elements of the periodic table, one or more rare earth transitional metal oxide perovskites, yttrium, and/or ytterbium, although claimed subject matter is not limited in scope in this respect. In an embodiment, a CEM device may comprise one or more materials selected from a group comprising aluminum, cadmium, chromium, cobalt, copper, gold, iron, manganese, mercury, molybdenum, nickel, palladium, rhenium, ruthenium, silver, tantalum, tin, titanium, vanadium, yttrium, and zinc (which may be linked to an anion, such as oxygen or other types of ligands), or combinations thereof, although claimed subject matter is not limited in scope in this respect.

FIG. 1A is an illustration of an embodiment 100 of a current density versus voltage profile of a device formed from a correlated electron material. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM device to a relatively low-impedance memory state. Conversely, application of a voltage $V_{reset}$ and a current density $J_{reset}$ reset may bring about a transition of the CEM device to a relatively high-impedance memory state. As shown in FIG. 1A, reference designator 110 illustrates the voltage range that may separate $V_{set}$ from $V_{reset}$. Following placement of the CEM device into a high-impedance state or a low-impedance state, the particular state of the CEM device may be detected by application of a voltage $V_{read}$ (e.g., during a read operation) and detection of a current or current density at terminals of the CEM device (e.g., utilizing read window 107).

According to an embodiment, the CEM device characterized in FIG. 1A may comprise any transition metal oxide (TMO), such as, for example, perovskites, Mott insulators, charge exchange insulators, and Anderson disorder insulators. In particular implementations, a CEM device may be formed from switching materials, such as nickel oxide, cobalt oxide, iron oxide, yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells may exhibit sufficient impedance switching properties for use in a CEM device. Other implementations may employ other transition metal compounds without deviating from claimed subject matter.

In one aspect, the CEM device of FIG. 1A may comprise materials that are transition metal oxide variable impedance materials, though it should be understood that these are exemplary only and are not intended to limit claimed subject matter. Particular implementations may employ other variable impedance materials as well. Nickel oxide, NiO, is disclosed as one particular TMO. NiO materials discussed herein may be doped with extrinsic ligands, which may establish and/or stabilize variable impedance properties. In particular, NiO variable impedance materials disclosed herein may include a carbon-containing ligand such as carbonyl (CO), forming NiO:CO. In another particular example, NiO doped with extrinsic ligands may be expressed as NiO:$L_x$, where $L_x$ is a ligand element or compound and x indicates a number of units of the ligand for one unit of NiO. One skilled in the art may determine a value of x for any specific ligand and any specific combination of ligand with NiO or any other transition metal compound simply by balancing valences. Other dopant ligands comprising back donating materials in addition to carbonyl include: nitrosyl (NO), triphenylphoshsphine ($PPH_3$), phenanthroline ($C_{12}H_8N_2$), bipyridine ($C_{10}H_8N_2$), ethylenediamine [$C_2H_4(NH_2)_2$], ammonia ($NH_3$), acetonitrile ($CH_3CN$), Fluoride (F), Chloride (Cl), Bromide (Br), cyanide (CN), sulfur (S) and others.

In another aspect, the CEM device of FIG. 1A may comprise materials that are transition metal oxide variable impedance materials, though it should be understood that these are exemplary only and are not intended to limit claimed subject matter. Particular implementations may employ other variable impedance materials as well. Nickel oxide (NiO) is disclosed as one particular TMO. NiO materials discussed herein may be doped with extrinsic ligands, which may stabilize variable impedance properties. In particular, NiO variable impedance materials disclosed herein may include nitrogen-containing molecules of the form $C_xH_yN_z$ (in which x,y≥0, and N≥1) such as: ammonia ($NH_3$), cyano ($CN^-$), azide ion ($N_3^-$) ethylene diamine ($C_2H_8N_2$), phen(1,10-phenanthroline) ($C_{12}H_8N_2$), 2,2'bipyridine ($C_{10}$,$H_8N_2$), ethylenediamine (($C_2H_4(NH_2)_2$), pyridine ($C_5H_5N$), acetonitrile ($CH_3CN$), and cyanosulfanides such as thiocyanate ($NCS^-$), for example. Members of a nitrogen oxide family ($N_xO_y$), which may include, for example, nitric oxide (NO), nitrous oxide ($N_2O$), nitrogen dioxide ($NO_2$), or precursors with an $NO_3^-$ ligand. In embodiments, metal precursors comprising nitrogen-containing ligands, such as ligands amines, amides, alkylamides nitrogen-containing ligands with NiO by balancing valences.

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM device may switch from a relatively low-impedance state to a relatively high-impedance state, for example, responsive to a Mott transition. This may correspond to point 108 of the voltage versus current density profile of FIG. 1A. At, or suitably nearby this point, electrons are no longer screened and become localized near the metal ion. This correlation may result in a strong electron-to-electron interaction potential which may operate to split the bands to form a relatively high-impedance material. If the CEM device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain embodiments, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

According to an embodiment, current in a CEM device may be controlled by an externally applied "compliance" condition, which may be determined at least partially on the basis of an applied external current, which may be limited during a write operation, for example, to place the CEM device into a relatively high-impedance state. This externally-applied compliance current may, in some embodiments, also set a condition of a current density for a subsequent reset operation to place the CEM device into a relatively high-impedance state. As shown in the particular implementation of FIG. 1A, a current density $J_{comp}$ may be applied during a write operation at point 116 to place the CEM device into a relatively high-impedance state, may determine a compliance condition for placing the CEM device into a low-impedance state in a subsequent write operation. As shown in FIG. 1A, the CEM device may be subsequently placed into a low-impedance state by application of a current density $J_{reset} \geq J_{comp}$ at a voltage $V_{reset}$ at point 108, at which $J_{comp}$ is externally applied.

In embodiments, compliance may set a number of electrons in a CEM device which may be "captured" by holes for the Mott transition. In other words, a current applied in a write operation to place a CEM device into a relatively low-impedance memory state may determine a number of holes to be injected to the CEM device for subsequently transitioning the CEM device to a relatively high-impedance memory state.

As pointed out above, a reset condition may occur in response to a Mott transition at point 108. As pointed out above, such a Mott transition may bring about a condition in a CEM device in which a concentration of electrons n approximately equals, or becomes at least comparable to, a concentration of electron holes p. This condition may be modeled according to expression (1) as follows:

$$\lambda_{TF}n^{\frac{1}{3}} = C \sim 0.26 \quad (1)$$
$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 104 of the voltage versus current density profile shown in FIG. 1A, may exist in response to injection of holes from a voltage signal applied across terminals of a CEM device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \quad (2)$$
$$Q(V_{MI}) = qn(V_{MI})$$

Where $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $V_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$
$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

In which $A_{CEM}$ is a cross-sectional area of a CEM device; and $J_{reset}(V_{MI})$ may represent a current density through the CEM device to be applied to the CEM device at a threshold voltage $V_{MI}$, which may place the CEM device into a relatively high-impedance state.

Figure 1B:
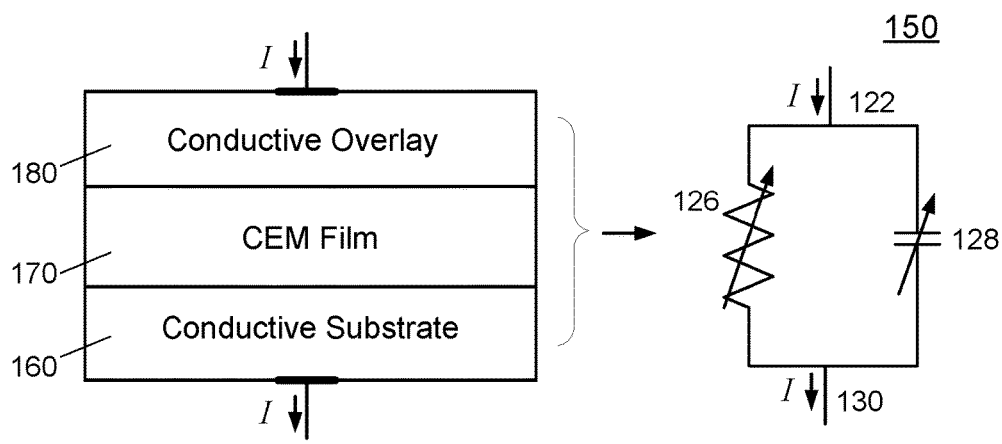
FIG. 1B is an illustration of an embodiment of a switching device comprising a correlated electron material and a schematic diagram of an equivalent circuit of a correlated electron material switch.

FIG. 1B is an illustration of an embodiment 150 of a switching device comprising a correlated electron material and a schematic diagram of an equivalent circuit of a correlated electron material switch. As previously mentioned, a correlated electron device, such as a CEM switch, a CERAM array, or other type of device utilizing one or more correlated electron materials may comprise variable or complex impedance device that may exhibit characteristics of both variable resistance and variable capacitance. In other words, impedance characteristics for a CEM variable impedance device, such as a device comprising a conductive substrate 160, CEM 170, and conductive overlay 180, may depend at least in part on resistance and capacitance characteristics of the device if measured across device terminals 122 and 130. In an embodiment, an equivalent circuit for a variable impedance device may comprise a variable resistor, such as variable resistor 126, in parallel with a variable capacitor, such as variable capacitor 128. Of course, although a variable resistor 126 and variable capacitor 128 are depicted in FIG. 1B as comprising discrete components, a variable impedance device, such as device of embodiment 150, may comprise a substantially homogenous CEM and claimed subject matter is not limited in this respect.

Table 1 below depicts an example truth table for an example variable impedance device, such as the device of embodiment 150.

TABLE 1

| Correlated Electron Switch Truth Table | | |
|---|---|---|
| Resistance | Capacitance | Impedance |
| $R_{high}$ ($V_{applied}$) | $C_{high}$ ($V_{applied}$) | $Z_{high}$ ($V_{applied}$) |
| $R_{low}$ ($V_{applied}$) | $C_{low}$ ($V_{applied}$)~0 | $Z_{low}$ ($V_{applied}$) |

In an embodiment, Table 1 shows that a resistance of a variable impedance device, such as the device of embodiment 150, may transition between a low-impedance state and a substantially dissimilar, high-impedance state as a function at least partially dependent on a voltage applied across the CEM device. In an embodiment, an impedance exhibited at a low-impedance state may be approximately in the range of 10.0-100,000.0 times lower than an impedance exhibited in a high-impedance state. In other embodiments, an impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between high-impedance states and low-impedance states. Table 1 shows that a capacitance of a variable impedance device, such as the device of embodiment 150, may transition between a lower capacitance state, which, in an example embodiment, may comprise approximately zero, or very little, capacitance, and a higher capacitance state that is a function, at least in part, of a voltage applied across the CEM device.

According to an embodiment, a CEM device, which may be utilized to form a CEM switch, a CERAM memory device, or a variety of other electronic devices comprising one or more correlated electron materials, may be placed into a relatively low-impedance memory state, such as by transitioning from a relatively high-impedance state, for example, via injection of a sufficient quantity of electrons to satisfy a Mott transition criteria. In transitioning a CEM device to a relatively low-impedance state, if enough electrons are injected and the potential across the terminals of the CEM device overcomes a threshold switching potential (e.g., $V_{set}$), injected electrons may begin to screen. As previously mentioned, screening may operate to unlocalize double-occupied electrons to collapse the band-splitting potential, thereby bringing about a relatively low-impedance state.

In particular embodiments, changes in impedance states of CEM devices, such as from a low-impedance state to a substantially dissimilar high-impedance state, for example, may be brought about by the "back-donation" of electrons of compounds comprising $Ni_xO_y$ (wherein the subscripts "x" and "y" comprise whole numbers). As the term is used herein, "back-donation" refers to a supplying of one or more electrons to a transition metal, transition metal oxide, or any combination thereof, by an adjacent molecule of the lattice structure, for example, comprising the transition metal, transition metal compound, transition metal oxide, or combination thereof. Back-donation permits a transition metal, transition metal compound, transition metal oxide, or combination thereof, to maintain an ionization state that is favorable to electrical conduction under an influence of an applied voltage. In certain embodiments, back-donation in a CEM, for example, may occur responsive to use of carbonyl (CO) or a nitrogen-containing dopant comprising a back-donating material, such as ammonia ($NH_3$), ethylene diamine ($C_2H_8N_2$), or members of a nitrogen oxide family ($N_xO_y$), for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in nickel oxide material (e.g., NiO:CO or NiO:$NH_3$), thereby permitting the nickel oxide material to switch to exhibiting a substantially dissimilar impedance property, such as a high-impedance property, during device operation.

Thus, in this context, a back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the material.

In some embodiments, by way of back-donation, a CEM switch comprising a transition metal, transition metal compound, or a transition metal oxide, may exhibit low-impedance properties if the transition metal, such as nickel, for example, is placed into an oxidation state of 2+ (e.g., $Ni^{2+}$ in a material, such as NiO:CO or NiO:$NH_3$). Conversely, electron back-donation may be reversed if the transition metal, such as nickel, for example, is placed into an oxidation state of either 1+ or 3+. Accordingly, during operation of a CEM device, back-donation may result in "disproportionation," which may comprise substantially simultaneous oxidation and reduction reaction, substantially in accordance with expression (4), below:

$$2Ni^{2+} \rightarrow Ni^{1+} + Ni^{3+} \quad (4)$$

Such disproportionation, in this instance refers to formation of nickel ions as $Ni^{1+} + Ni^{3+}$ as shown in expression (4), which may bring about, for example, a relatively high-impedance state during operation of the CEM device. In an embodiment, a dopant comprising a back-donating material, such as a carbon containing ligand, carbonyl (CO) or a nitrogen-containing ligand, such as an ammonia molecule ($NH_3$), may permit sharing of electrons during operation of the CEM device so as to permit the disproportionation reaction of expression (4), and its reversal, substantially in accordance with expression (5), below:

$$Ni^{1+} + Ni^{3+} \rightarrow 2Ni^{2+} \quad (5)$$

As previously mentioned, reversal of the disproportionation reaction, as shown in expression (5), permits nickel-based CEM to return to a relatively low-impedance state In embodiments, depending on a molecular concentration of NiO:CO or NiO:$NH_3$, for example, which may vary from values approximately in the range of an atomic percentage of 0.1% to 10.0%, $V_{reset}$ and $V_{set}$, as shown in FIG. 1A, may vary approximately in the range of 0.1 V to 10.0 V subject to the condition that $V_{set} \geq V_{reset}$. For example, in one possible embodiment, $V_{reset}$ may occur at a voltage approximately in the range of 0.1 V to 1.0 V, and $V_{set}$ may occur at a voltage approximately in the range of 1.0 V to 2.0 V, for example. It should be noted, however, that variations in $V_{set}$ and $V_{reset}$ may occur based, at least in part, on a variety of factors, such as atomic concentration of a back-donating material, such as NiO:CO or NiO:$NH_3$ and other materials present in the CEM device, as well as other process variations, and claimed subject matter is not limited in this respect.

In certain embodiments, atomic layer deposition may be utilized to form or to fabricate films comprising nickel oxide materials, such as NiO:CO or NiO:$NH_3$, to permit electron back-donation during operation of the CEM device in a circuit environment, for example, to give rise to a low-impedance state. Also during operation in a circuit environment, for example, electron back-donation may be reversed so as to give rise to a substantially dissimilar impedance state, such as a high-impedance state, for example. In particular embodiments, atomic layer deposition may utilize two or more precursors to deposit components of, for example, NiO:CO or NiO:$NH_3$, or other transition metal oxide, transition metal, or combination thereof, onto a conductive substrate. In an embodiment, layers of a CEM device may be deposited utilizing separate precursor molecules, AX and BY, according to expression (6a), below:

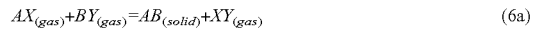

$$AX_{(gas)} + BY_{(gas)} = AB_{(solid)} + XY_{(gas)} \quad (6a)$$

Wherein "A" of expression (6a) corresponds to a transition metal, transition metal compound, transition metal oxide, or any combination thereof. In embodiments, a transition metal oxide may comprise nickel, but may comprise other transition metals, transition metal compound, and/or transition metal oxides, such as aluminum, cadmium, chromium, cobalt, copper, gold, iron, manganese, mercury, molybdenum, nickel palladium, rhenium, ruthenium, silver, tin, titanium, vanadium. In particular embodiments, compounds that comprise more than one transition metal oxide may also be utilized, such as yttrium titanate ($YTiO_3$).

In embodiments, "X" of expression (6a) may comprise a ligand, such as organic ligand, comprising amidinate (AMD), dicyclopentadienyl $(Cp)_2$, diethylcyclopentadienyl $(EtCp)_2$, Bis(2,2,6,6-tetramethylheptane-3,5-dionato) $((thd)_2)$, acetylacetonate (acac), bis(methylcyclopentadienyl) $((CH_3C_5H_4)_2)$, dimethylglyoximate $(dmg)_2$, 2-amino-pent-2-en-4-onato $(apo)_2$, $(dmamb)_2$ where dmamb=1-dimethylamino-2-methyl-2-butanolate, (dmamp)2 where dmamp=1-dimethylamino-2-methyl-2-propanolate, Bis(pentamethylcyclopentadienyl) $(C_5(CH_3)_5)_2$ and carbonyl $(CO)_4$. Accordingly, in some embodiments, nickel-based precursor AX may comprise, for example, nickel amidinate (Ni (AMD)), nickel dicyclopentadienyl (Ni$(Cp)_2$), nickel diethylcyclopentadienyl (Ni$(EtCp)_2$), Bis(2,2,6,6-tetramethyl-heptane-3,5-dionato)Ni(II) (Ni$(thd)_2$), nickel acetylacetonate (Ni$(acac)_2$), bis(methylcyclopentadienyl)nickel (Ni $(CH_3C_5H_4)_2$, Nickel dimethylglyoximate (Ni$(dmg)_2$), Nickel 2-amino-pent-2-en-4-onato (Ni$(apo)_2$), Ni$(dmamb)_2$ where dmamb=1-dimethylamino-2-methyl-2-butanolate, Ni $(dmamp)_2$ where dmamp=1-dimethylamino-2-methyl-2-propanolate, Bis(pentamethylcyclopentadienyl) nickel (Ni $(C_5(CH_3)_5)_2$, and nickel carbonyl (Ni$(CO)_4$), just to name a few examples. In expression (6a), precursor "BY" may comprise an oxidizer, such as oxygen ($O_2$), ozone ($O_3$), nitric oxide (NO), hydrogen peroxide ($H_2O_2$), just to name a few examples. In other embodiments, plasma may be used with an oxidizer to form oxygen radicals.

However, in particular embodiments, a dopant comprising a back-donating material in addition to precursors AX and BY may be utilized to form layers of the CEM device. An additional dopant ligand comprising a back-donating material, which may co-flow with precursor AX, may permit formation of back-donating compounds, substantially in accordance with expression (6b), below. In embodiments, a dopant comprising a back-donating material, such as ammonia (NH$_3$), methane (CH$_4$), carbon monoxide (CO), or other material may be utilized, as may other ligands comprising carbon or nitrogen or other dopants comprising back-donating materials listed above. Thus, expression (6a) may be modified to include an additional dopant ligand comprising a back-donating material substantially in accordance with expression (6b), below:

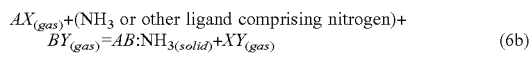  (6b)

It should be noted that concentrations, such as atomic concentration, of precursors, such as AX, BY, and NH$_3$ (or other ligand comprising nitrogen) of expressions (6a) and (6b) may be adjusted so as to bring about a final atomic concentration of nitrogen or carbon dopant comprising a back-donating material in a fabricated CEM device, such as in the form of ammonia (NH$_3$) or carbonyl (CO) comprising a concentration of between approximately 0.1% and 10.0%. However, claimed subject matter is not necessarily limited to the above-identified precursors and/or atomic concentrations. Rather, claimed subject matter is intended to embrace all such precursors utilized in atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition (GCM), or the like, utilized in fabrication of CEM devices. In expressions (6a) and (6b), "BY" may comprise an oxidizer, such as oxygen (O$_2$), ozone (O$_3$), nitric oxide (NO), hydrogen peroxide (H$_2$O$_2$), just to name a few examples. In other embodiments, plasma may be used with an oxidizer (BY) to form oxygen radicals. Likewise, plasma may be used with the doping species comprising a back-donating material to form an activated species to control the doping concentration of the CEM.

In particular embodiments, such as embodiments utilizing atomic layer deposition, a substrate may be exposed to precursors, such as AX and BY, as well as dopants comprising back-donating materials (such as ammonia or other ligands comprising metal-nitrogen bonds, including, for example, nickel-amides, nickel-imides, nickel-amidinates, or combinations thereof) in a heated chamber, which may attain, for example, a temperature approximately in the range of 20.0° C. to 1000.0° C., for example, or between temperatures approximately in the range of 20.0° C. and 500.0° C. in certain embodiments. In one particular embodiment, in which atomic layer deposition of NiO:NH$_3$, for example, is performed, temperature ranges approximately in the range of 20.0° C. and 400.0° C. may be utilized. Responsive to exposure to precursor gases (e.g., AX, BY, NH$_3$ or other ligand comprising nitrogen), such gases may be purged from the heated chamber for durations approximately in the range of 0.5 seconds to 180.0 seconds. It should be noted, however, that these are merely examples of potentially suitable ranges of temperature and/or time and claimed subject matter is not limited in this respect.

In certain embodiments, a single two-precursor cycle (e.g., AX and BY, as described with reference to expression 6(a)) or a single three-precursor cycle (e.g., AX, NH$_3$, CH$_4$, or other ligand comprising nitrogen, carbon or other dopant comprising a back-donating material, and BY, as described with reference to expression 6(b)) utilizing atomic layer deposition may bring about a CEM device layer comprising a thickness approximately in the range of 0.6 Å to 5.0 Å per cycle). Accordingly, in an embodiment, to form a CEM device film comprising a thickness of approximately 500.0 Å utilizing an atomic layer deposition process in which layers comprise a thickness of approximately 0.6 Å, 800-900 cycles, for example, may be utilized. In another embodiment, utilizing an atomic layer deposition process in which layers comprise approximately 5.0 Å, 100 two-precursor cycles, for example. It should be noted that atomic layer deposition may be utilized to form CEM device films having other thicknesses, such as thicknesses approximately in the range of 1.5 nm and 150.0 nm, for example, and claimed subject matter is not limited in this respect.

In particular embodiments, responsive to one or more two-precursor cycles (e.g., AX and BY), or three-precursor cycles (AX, NH$_3$, CH$_4$ or other ligand comprising nitrogen, carbon or other dopant comprising a back-donating material and BY), of atomic layer deposition, a CEM device film may undergo in situ annealing, which may permit improvement of film properties or may be used to incorporate the dopant comprising a back-donating material, such as in the form of carbonyl or ammonia, in the CEM device film. In certain embodiments, a chamber may be heated to a temperature approximately in the range of 20.0° C. to 1000.0° C. However, in other embodiments, in situ annealing may be performed utilizing temperatures approximately in the range of 100.0° C. to 800.0° C. In situ annealing times may vary from a duration approximately in the range of 1.0 seconds to 5.0 hours. In particular embodiments, annealing times may vary within more narrow ranges, such as, for example, from approximately 0.5 minutes to approximately 180.0 minutes, for example, and claimed subject matter is not limited in these respects.

In particular embodiments, a CEM device manufactured in accordance with the above-described process may exhibit a "born on" property in which the device exhibits relatively low impedance (relatively high conductivity) immediately after fabrication of the device. Accordingly, if a CEM device is integrated into a larger electronics environment, for example, at initial activation a relatively small voltage applied to a CEM device may permit a relatively high current flow through the CEM device, as shown by region 104 of FIG. 1A. For example, as previously described herein, in at least one possible embodiment, V$_{reset}$ may occur at a voltage approximately in the range of 0.1 V to 1.0 V, and V$_{set}$ may occur at a voltage approximately in the range of 1.0 V to 2.0 V, for example. Accordingly, electrical switching voltages operating in a range of approximately 2.0 V, or less, may permit a memory circuit, for example, to write to a CERAM memory device, to read from a CERAM memory device, or to change state of a CERAM switch, for example. In embodiments, such relatively low voltage operation may reduce complexity, cost, and may provide other advantages over competing memory and/or switching device technologies.

Figure 2A:
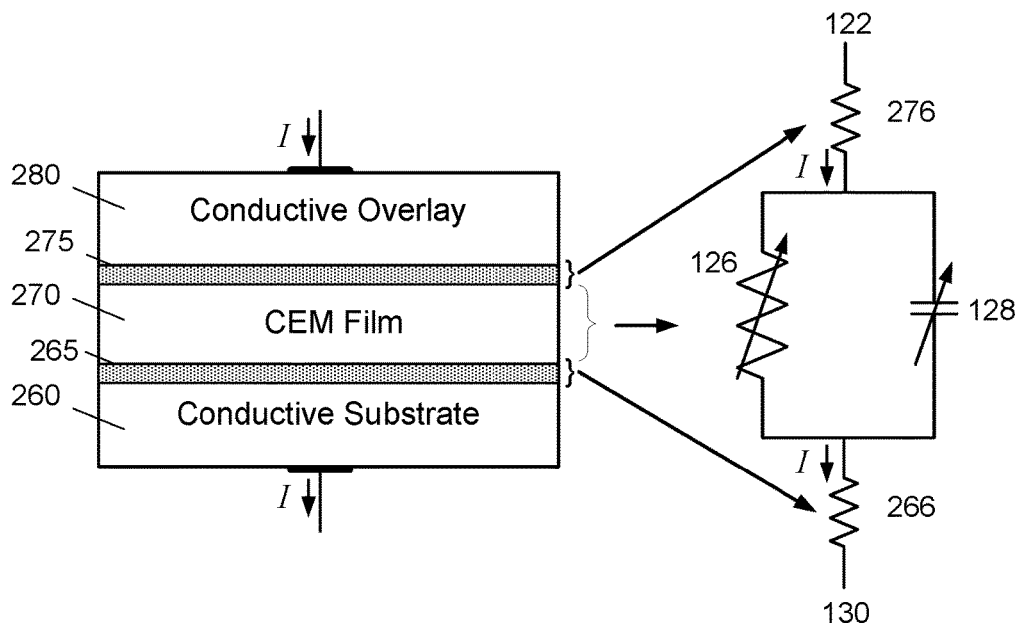
FIG. 2A is an illustration of an embodiment of a correlated electron material switching device comprising an oxide at interfacial layers between a conductive material and a correlated electron material.

FIG. 2A is an illustration of an embodiment 200 of a correlated electron material switching device comprising an oxide at interfacial layers between a conductive material and a correlated electron material. A conductive substrate, such as conductive substrate 260, for example, may comprise a titanium nitride (TiN) substrate fabricated in layers, for example, for use in a CERAM device or other type of CEM-based device. Accordingly, conductive substrate 260 may be fabricated utilizing, for example, TiN deposition, sputtering, chemical vapor deposition, atomic layer deposition, or other suitable process, and claimed subject matter is not limited in this respect.

On occasion, during formation of conductive substrate 260, and/or during subsequent processing, oxidation layer 265 may form over conductive substrate 260. For example, in an embodiment, if CEM film 270, which may be deposited in layers over conductive substrate 260, utilizes a transition metal oxide, such as NiO, oxygen atoms from CEM film 270 may migrate or diffuse towards conductive substrate 260. At times, such oxygen migration from CEM film 270 may give rise to an interfacial oxidation layer, such as oxidation layer 265, which may introduce resistance to an electric current flowing (I) between CEM film 270 and conductive substrate 260. In particular embodiments, oxidation layer 265 may comprise a thickness that may range from approximately 0.5 Å to, for example, approximately an entire thickness of the CEM film.

Likewise, in at least some instances, after formation of CEM film 270, which may comprise a transition metal oxide deposited in layers utilizing one or more approaches previously described herein (e.g., atomic layer deposition, chemical vapor deposition, plasma chemical vapor deposition, etc.), oxygen migrated or diffused from CEM film 270 may bring about formation of oxidation layer 275. In particular embodiments, oxidation layer 275 may comprise a thickness that may range from approximately 0.5 Å, for example, to approximately the entire thickness of the CEM film. In particular embodiments, conductive substrate 260 may comprise any number of conductive materials such as titanium nitride, platinum, titanium, copper, aluminum, cobalt, nickel, tungsten, tungsten nitride, cobalt silicide, ruthenium oxide, chromium, gold, palladium, indium tin oxide, tantalum, silver, iridium, or any combination thereof, and claimed subject matter is not limited to any particular composition of conductive substrate material. In addition, conductive overlay 280, which may be disposed over oxidation layer 275, may be formed from a material that is substantially similar to a material used in forming conductive substrate 260. As the term is used herein, "substantially similar" materials may refer to materials at least similar in composition, such as being constructed or formed from one of the above-mentioned materials (e.g., titanium nitride, platinum, titanium, etc.) or may be constructed or formed from materials that are at least similarly grouped in the periodic table of elements. Substantially similar materials may also refer to materials having at least similar electrical properties, such as similar ranges of electrical conductivity and/or similar ranges of complex impedance, and/or materials that comprise other electrical properties that are similar to one another, and claimed subject matter is not limited in this respect.

As shown in FIG. 2A, oxidation layer 275 may be modeled using equivalent resistance 276 disposed between device terminal 122 and the parallel combination of variable resistance 126 with variable capacitance 128. Likewise, oxidation layer 265 may be modeled using equivalent resistance 266 disposed between device terminal 130 and the parallel combination of variable resistance 126 with variable capacitance 128. In particular embodiments, resistances 266 and 276 may bring about degraded electrical performance of a CEM device.

Figure 2B:
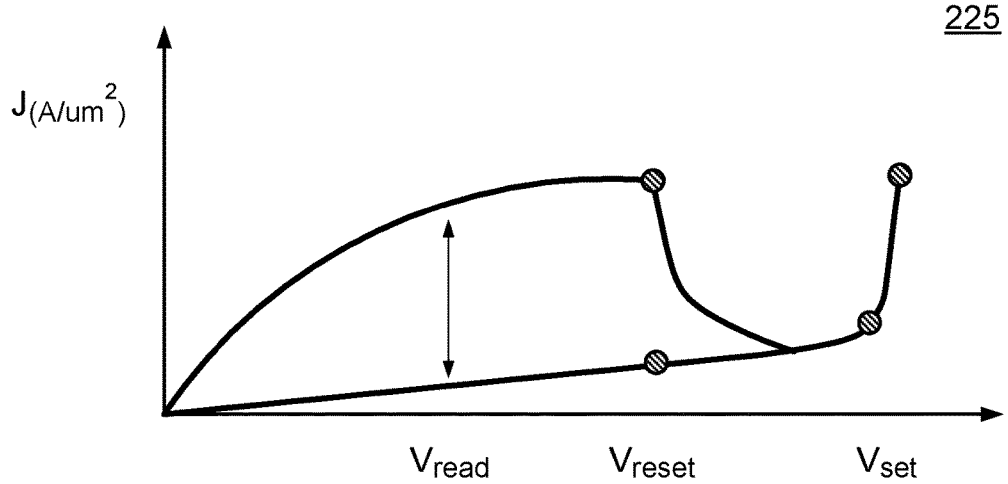
FIG. 2B is an illustration of an embodiment of a current density versus voltage profile corresponding to the example switching device of FIG. 2A.

FIG. 2B is an illustration of an embodiment 225 of a current density versus voltage profile corresponding to the example switching device of FIG. 2A. As illustrated in FIG. 2B, responsive to introduction of oxidation layers 265 and 275, of FIG. 2A, which may operate to add potentially parasitic resistances to an equivalent circuit representing the CEM switching device of embodiment 200, for example, $V_{read}$, $V_{reset}$, and $V_{set}$ may be substantially (and undesirably) increased. In one possible example, $V_{set}$ may comprise a voltage level approximately in the range of 3.0 V to 4.0 V, for example. Thus, electrical switching voltages to bring about a change of state of a CERAM memory device, for example, may be increased significantly, such as from approximately 1.0 V to 2.0 V as described in reference to FIG. 1A, for example, to 3.0 V to 4.0 V, at least in certain instances as described with reference to FIG. 2A.

Figure 2C:
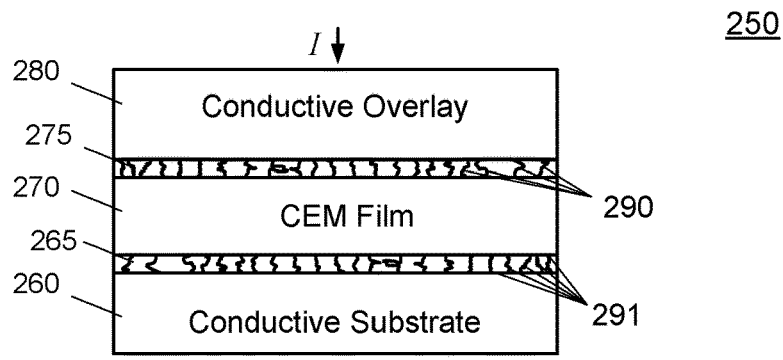
FIG. 2C is an illustration of an embodiment of a switching device comprising filaments formed at interfacial layers between conductive material and a correlated electron material.

FIG. 2C is an illustration of an embodiment 250 of a switching device comprising filaments formed at interfacial layers between a conductive material and a correlated electron material. As shown in FIG. 2C, responsive to application of a voltage within a particular range, such as, for example, between approximately 3.0 V and approximately 4.0 V, oxidation layer 275 may develop one or more filaments, such as filaments 290, which may comprise conductive crystalline, low-resistance paths between conductive overlay 280 and CEM film 270. Likewise, a voltage of between, for example, approximately 3.0 V and approximately 4.0 V may bring about formation of filaments 291 between CEM film 270 and conductive substrate 260. Formation of filaments 290 may bring about operation of a switching device that more closely approximates the current density versus voltage profile of FIG. 1A.

However, although formation of filaments within a CEM device may permit the device to perform switching operations responsive to application of voltage levels approximately in the range of 2.0 V, or less, for example, the need to apply filament-forming voltages of, for example, approximately 3.0 V to approximately 4.0 V may be undesirable in particular instances. Accordingly, in certain embodiments, it may be advantageous to reduce or eliminate a need to form conductive filaments so as to allow a low-impedance path for electrical current flowing from conductive substrate 260 to CEM film 270 and to conductive material 280, for example. Avoidance of a need for filament-forming voltages may preserve the "born on" property of a CEM device, which refers to a CEM device's ability to exhibit a relatively low impedance (relatively high conductivity) responsive to fabrication of the device.

Figure 3A:
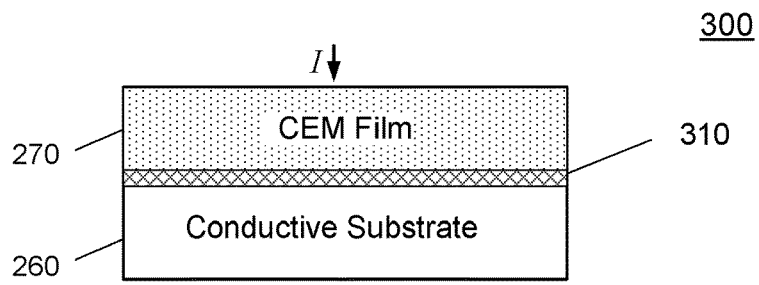
FIG. 3A is an illustration of an embodiment of interfacial layer between a correlated electron material and a conductive substrate wherein the interfacial layer comprises a reduced impedance.

FIG. 3A is an illustration of an embodiment 300 of a CEM disposed over a conductive material and an interfacial layer. In an embodiment 300, for example, conductive substrate 260 may be formed by any suitable process such as, for example, atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition or the like, and claimed subject matter is not limited in this respect. As previously mentioned, conductive substrate 260 may comprise any number of conductive materials, such as titanium nitride, platinum, titanium, copper, and so forth, and claimed subject matter is not limited to any particular composition of conductive substrate 260.

As previously described in relation to FIGS. 2A-2C, if a CEM is deposited in layers over a conductive substrate, such as conductive substrate 260, a potentially parasitic oxidation layer, such as oxidation layer 265, may form at an interfacial layer between the conductive substrate from the CEM. Further, formation of such an interfacial layer comprising an oxide material may bring about an unwanted resistance to an electrical current flowing between a conductive substrate and a CEM. In particular embodiments, such as embodiments in which conductive substrate 260 comprises titanium nitride, an oxidation layer may form based, at least in part, on an ambient temperature of a gaseous environment in which oxygen is present. For example, in particular embodiments, oxygen formation at a titanium nitride (TiN) substrate may occur at temperatures as low as 23.0° C. and may form more rapidly with an increased temperature.

Accordingly, in particular embodiments, such as embodiment 300 (FIG. 3A), a conductive substrate may be exposed to an agent, which may operate to inhibit or prevent formation of oxides at interfacial layer 310. Thus, a "born on" property of the CEM device may be preserved in which "born on" refers to a CEM device's ability to exhibit a relatively low impedance (relatively high electrical conductivity) after fabrication of the device.

Figure 3B:
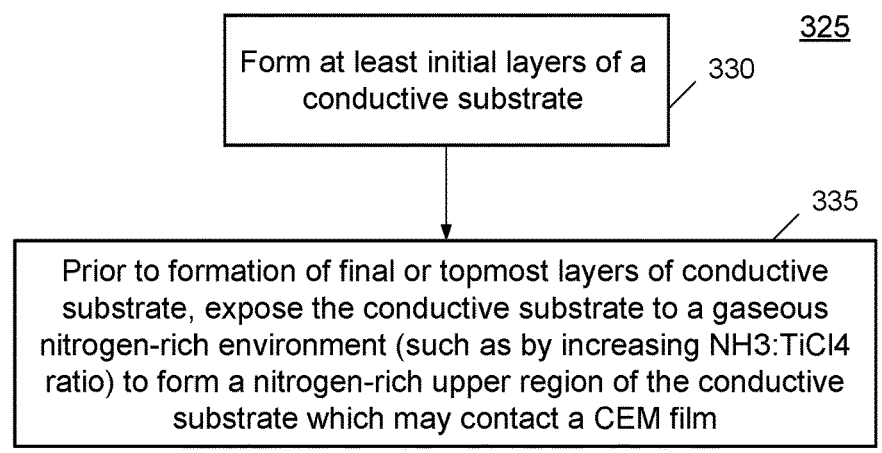
FIGS. 3B-3D are flowcharts of embodiments for processes for fabricating correlated electron material device with reduced interfacial impedance.

In particular embodiments, such as embodiment 300 shown in FIG. 3A, a relatively high electrical conductivity of interfacial layer 310 may be brought about via formation of a layer resistant to being oxidized or that inhibits oxidation during the deposition of the CEM or other subsequent processing. Accordingly, a oxidation-resistant or oxidation-inhibiting film may be deposited over film 270, deposited over a conductive substrate, or formed during a final portion of the conductive film formation, such as conductive substrate 260. In an example, during formation of the final or topmost layers of conductive substrate 260, the conductive substrate may be exposed to a gaseous nitrogen environment comprising a higher concentration of nitrogen than utilized to form layers under interfacial layer 310. Thus, for example, during a latter portion a process to fabricate conductive substrate 260, the substrate may be exposed to a gaseous environment comprising titanium tetrachloride plus ammonia (TiCl$_4$+NH$_3$), just to name a particular gaseous mixture. Responsive to exposure of conductive substrate 260, in a final formation, the relative percentage of NH$_3$ may be increased to bring about an increase in the amount of nitrogen in the TiN film for an upper portion of the conductive substrate represented by region 310 in FIG. 3A Thus, as shown in the flowchart of FIG. 3B, a process for fabricating a CEM devices with reduced interfacial layer impedance, according to embodiment 325, may begin at block 330 with formation of at least initial layers of a conductive substrate. A conductive substrate may comprise, for example, TiN, although claimed subject matter is not limited in this respect. The method may further include block 335, in which, prior to formation of final or topmost layers of the conductive substrate, may comprise exposing the conductive substrate to a gaseous nitrogen-rich environment such as, for example, by increasing the ratio of NH3:TiCl$_4$ or, for example, by flowing NH$_3$ without TiCl$_4$. This may bring about formation of a nitrogen-rich upper region of the conductive substrate that may contact a CEM film.

In another embodiment, a relatively high electrical conductivity of interfacial layer 310 of FIG. 3A may be brought about via annealing a substantially complete conductive substrate in a nitrogen-rich gaseous environment comprising, for example, gaseous ammonia (NH$_3$). In a possible embodiment, after substantial completion of the formation of conductive substrate 260, for example, and prior to formation of a first layer of CEM film 270 over a conductive substrate, annealing a conductive substrate in a nitrogen-rich gaseous environment may operate to inhibit formation of a higher resistivity, non-CEM based, oxide at an interface of the CEM and a conductive substrate via formation of an oxidation resistant interfacial layer 310 of FIG. 3A. Annealing may take place with added energy sources including direct or remote plasma sources, hot wire to assist in decomposing nitrogen-containing molecules, ultraviolet radiation (UV); or thermal annealing in combination with the above energy sources. In addition a GCM process may be used to incorporate nitrogen or a nitrogen rich, thin film at the TMO/electrode region.

Figure 3C:
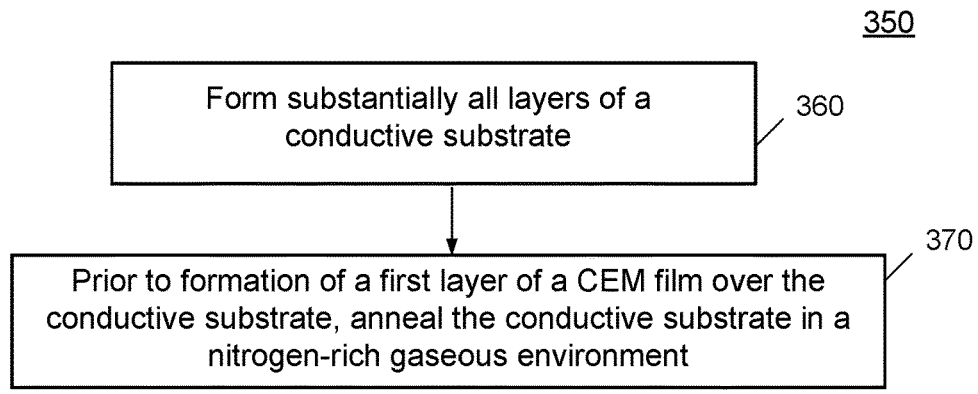

Thus, as shown in the flowchart of FIG. 3C, a process for fabricating a CEM with reduced interfacial layer impedance, according to an embodiment 350, may begin at block 360 with formation of substantially all layers of the conductive substrate. The method may further include block 370, in which, prior to formation of a first layer of a CEM film over the conductive substrate, may comprise annealing the conductive substrate in a gaseous nitrogen environment.

In another embodiment, a relatively high electrical conductivity interfacial layer 310 of FIG. 3A may be achieved by way of growing, for example, one or more layers, such as layers accumulating to a total of less than approximately 10.0 nm, of a metal oxide or metal oxynitride. In embodiments, one or more metal oxide or metal oxynitride layers may give rise to conductivity that permits a CEM device to behave in accordance with voltage regime of layer 170 of FIG. 1B, for example. A metal oxide or metal oxynitride may operate to form a barrier, for example, to prevent or inhibit migration and/or diffusion of oxygen such as, for example, oxygen diffusing from one or more layers of CEM (e.g. NiO). In one possible example, a NiTiOxNy film may be formed via exposing a conductive substrate to an oxynitridation process, which may involve exposure of a titanium nitride substrate to an environment comprising gaseous nitric oxide at a relatively low pressure or for a relatively short duration, such as between approximately 5.0 Pa and approximately 13,000 Pa (approximately 0.04 Torr to approximately 100 Torr) for between approximately 1.0 seconds and 600.0 seconds, for example.

Figure 3D:
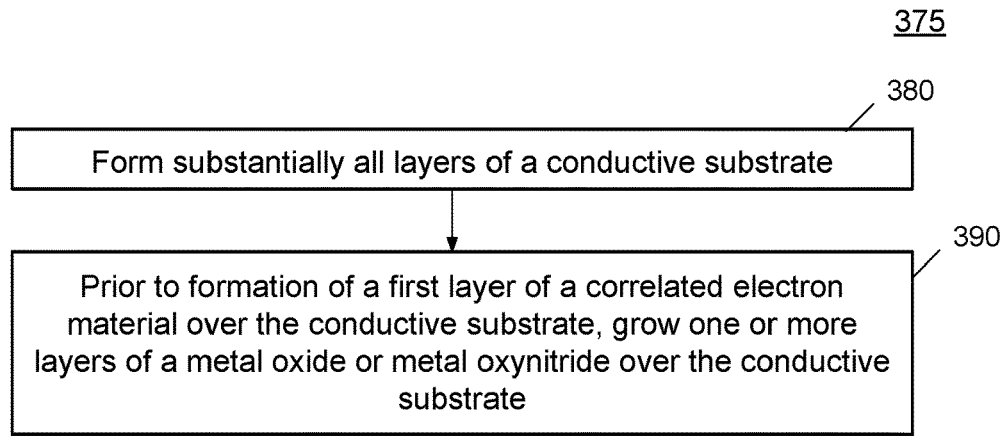

Thus, as shown in the flowchart of FIG. 3D, a process for fabricating a CEM device with reduced interfacial layer impedance, according to an embodiment 375, may begin at block 380 with formation substantially all layers of the conductive substrate. The method may further include block 390, in which, prior to formation of a first layer of a CEM film over the conductive substrate, comprises growing one or more layers of a metal oxide or metal oxynitride layer over the conductive substrate.

Thus, in particular embodiments, prior to formation of a first layer of CEM over a conductive substrate, introduction of additional nitrogen may inhibit formation of an oxide layer at interfacial layer 310 of a conductive substrate, such as the conductive substrate of FIG. 3A. In one embodiment, such as that of FIG. 3B, introduction of additional nitrogen prior to completing the formation of a conductive substrate may prevent or inhibit formation of resistive oxides at interfacial layer 310. In another embodiment, such as that of FIG. 3C, annealing a conductive substrate in a nitrogen-rich gaseous environment, such as a gaseous environment comprising ammonia, may prevent or inhibit formation of resistive oxides at interfacial layer 310. In another embodiment, such as that of FIG. 3D, formation of one or more layers of a metal oxide or metal oxynitride at interfacial layer 310 may operate as a barrier to prevent or inhibit formation of resistive oxides at interfacial layer 310. It should be noted that claimed subject matter is intended to embrace all such approaches that may operate to hinder formation of resistive oxides at interfacial layer 310.

Figure 4A:
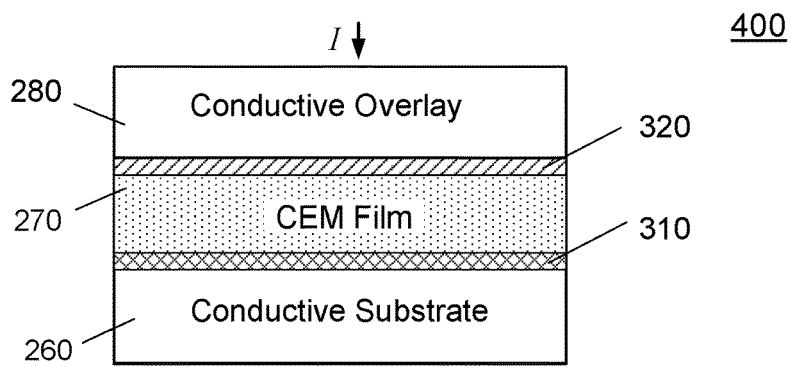
FIG. 4A is an illustration of an embodiment comprising a correlated electron material disposed over a conductive material, wherein interfacial layers between the correlated electron material and the conductive materials comprise reduced impedance.

FIG. 4A is an illustration showing embodiment 400 comprising a CEM film disposed over a conductive substrate, wherein interfacial layers are disposed over the correlated electron material and the conductive material. As previously described in reference to FIG. 3A, CEM film 270 may comprise a transition metal oxide such as, for example, NiO, although claimed subject matter is not limited in this respect. CEM film 270 may be fabricated utilizing, in one non-limiting example, an atomic layer deposition process in which layers of material may be formed using, for example, hundreds of two-precursor cycles (e.g., AX and BY, as described with reference to expression 6(a)) or a single three-precursor cycle (e.g., AX, $NH_3$ or other ligand comprising nitrogen, carbon or other back donating dopants, and BY, as described with reference to expression 6(b)) to obtain a CEM film having a thickness approximately in the range of 1.5 nm to 150.0 nm. After forming a CEM film, the material may be annealed at an elevated temperature, such as a temperature of between approximately 20.0° C. and 1000.0° C., which may assist in controlling grain structure, densifying CEM film 270 or otherwise improving material properties, performance, or endurance. In addition, the formation of the conductive overlay process may be performed at an elevated temperature. Formation of a conductive overlay may bring about a reaction of an overlay conductive material and the oxygen in a CEM. In embodiments, a reaction may give rise to formation of interfacial layer 320 in a manner that accords with the formation of interfacial layer 310, for example.

As previously described in reference to FIG. 3A, interfacial oxide layer 320 may hinder or impede an electrical current flowing to or from CEM film 270. Accordingly, in particular embodiments, such as embodiment 400, a CEM may be exposed to an agent, which may operate to inhibit or prevent formation of resistive oxides at interfacial layer 320. In certain embodiments, exposure of an agent operating to inhibit or prevent formation of oxides may bring about enhanced electrical conductivity of interfacial layer 320. Thus, a "born on" property of the CEM device may be preserved.

In particular embodiments, a reduction in the formation of oxides at interfacial layer 320 may be brought about via introduction of additional nitrogen, for example, during formation of final or topmost layers of CEM film 270. In a possible example, during a latter portion a process to fabricate layers of CEM film 270, the material may be exposed to a gaseous environment comprising titanium tetrachloride plus ammonia ($TiCl_4+NH_3$), although claimed subject matter may encompass additional contributors to a nitrogen-rich environment other than $TiCl_4+NH_3$.

Figure 4B:
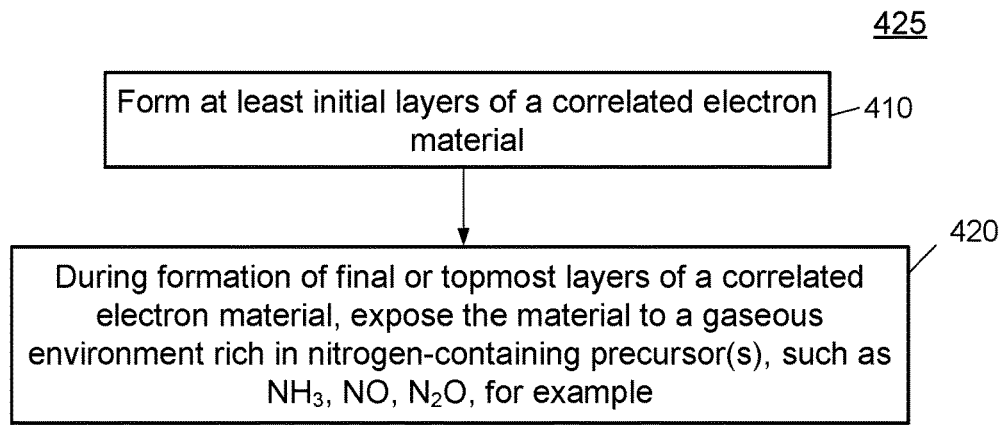
FIGS. 4B-4D are flowcharts of embodiments for processes for fabricating correlated electron material device with reduced interfacial impedance.

Thus, as shown in the flowchart of FIG. 4B, a process for fabricating a CEM device with reduced interfacial layer impedance, according to an embodiment 425, may begin at block 410 with formation of at least initial layers of a CEM film. A CEM film may comprise, for example, NiO, although claimed subject matter is not limited in this respect. The method may further include block 420, in which, during formation of final or topmost layers of a CEM film, the material may be exposed to gaseous environment comprising a gaseous environment rich in nitrogen-containing precursor, such as $NH_3$, NO, $N_2O$, for example.

In another embodiment, a relatively high electrical conductivity of interfacial layer 320 may be brought about via annealing a CEM film in a nitrogen-rich gaseous environment comprising, for example, gaseous ammonia ($NH_3$), nitric oxide (NO), or nitrous oxide ($N_2O$), just to name a few examples of gases that may comprise a nitrogen-rich environment. In a possible embodiment, after substantial completion of the formation of CEM film 270, for example, and prior to formation of conductive overlay 280 over a CEM film, annealing a CEM film in a nitrogen-rich gaseous environment may operate to inhibit or prevent formation of a relatively nonconductive oxide at interfacial layer 320. Responsive to preventing or inhibiting formation of a relatively non-conducting oxides, such as, for example, by way of nitrogen annealing prior to formation of a first layer of, for example, conductive overlay 280, may prevent or inhibit formation of resistive oxides at interfacial layer 320.

Figure 4C:
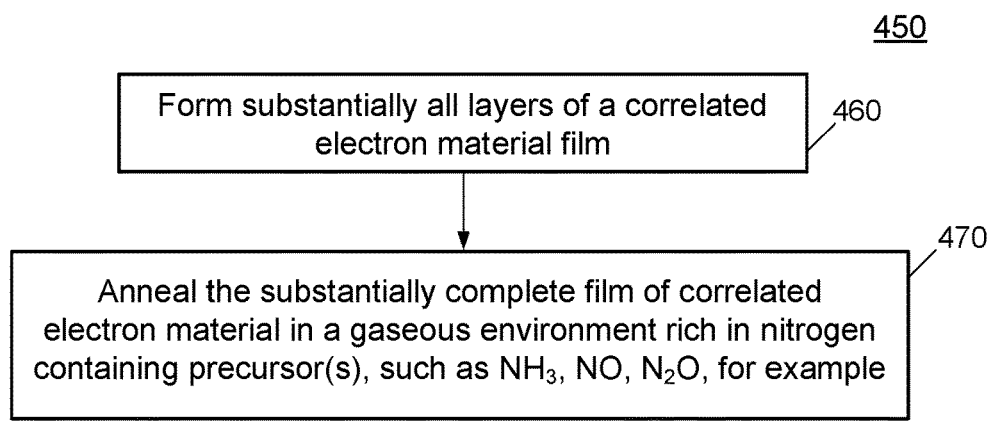

Thus, as shown in the flowchart of FIG. 4C, a process for fabricating a CEM device with reduced interfacial layer impedance, according to an embodiment 450, may begin at block 460 with formation of substantially all layers of a CEM film. The method may further include block 470, in which, prior to formation of a first layer of a conductive overlay, the substantially completed CEM film may be annealed in a nitrogen-rich environment comprising, for example, $NH_3$, $N_2O$, NO or any combination thereof. "Annealing" may and this anneal may include the use of direct or remote plasma, UV source, hot wire, or GCIB for example.

In another embodiment, relatively high electrical conductivity of interfacial layer 320 may be achieved by way of growing, for example, one or more layers, such as layers accumulating to less than approximately 10.0 nm, of a relatively conducting or CEM metal oxynitride (e.g., NiTiOxNy). A metal oxynitride may operate to form a barrier, for example, which may prevent or inhibit migration and/or diffusion of oxygen such as, for example, oxygen diffusing from one or more layers of a CEM film (e.g. NiO) in the direction of conductive overlay 280. In one possible example, a NiTiOxNy film may be formed via exposing a CEM film to an oxynitridation process, which may involve exposure of a CEM film to an environment comprising gaseous nitric oxide at a relatively low pressure such as between approximately 5.0 and approximately 13,000 Pa (approximately 0.04 Torr to approximately 100 Torr) for between approximately 1.0 seconds and 600.0 seconds, for example.

Figure 4D:
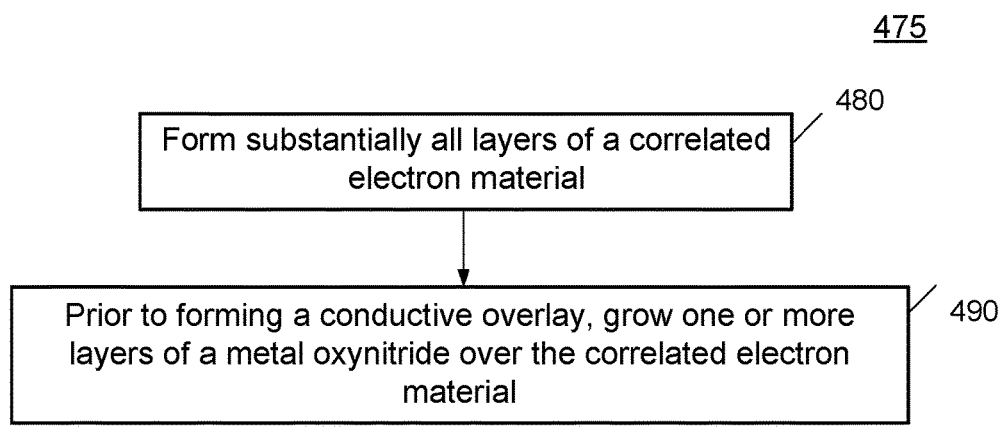

Thus, as shown in the flowchart of FIG. 4D, a process for fabricating a CEM device with reduced interfacial layer impedance, according to an embodiment 475, may begin at block 480 with formation of substantially all layers of a CEM film. The method may further include block 490, which, prior to forming a conductive overlay, may comprise a growing one or more layers of a metal oxynitride over the CEM film.

In particular embodiments, after formation of a portion of CEM film over a conductive material, introduction of additional nitrogen may inhibit formation of a relatively non-conducting oxide layer that does not behave as a CEM. In one embodiment, such as embodiment 425, introduction of additional nitrogen prior to completing the formation of a CEM film may prevent or inhibit formation of resistive oxides at interfacial layer 320. In another embodiment, such as embodiment 450, annealing a CEM film in a nitrogen-rich gaseous environment, such as a gaseous environment comprising ammonia, nitride oxide, or nitrous oxide, for example, may prevent or inhibit formation of resistive oxides at interfacial layer 320. In another embodiment, such as embodiment 475, formation of one or more layers of a metal oxynitride at interfacial layer 320 may operate as a barrier to prevent or inhibit formation of resistive oxides at interfacial layer 320. It should be noted that claimed subject matter is intended to embrace all such approaches that may operate to hinder formation of resistive oxides at interfacial layer 320.

Figure 5:
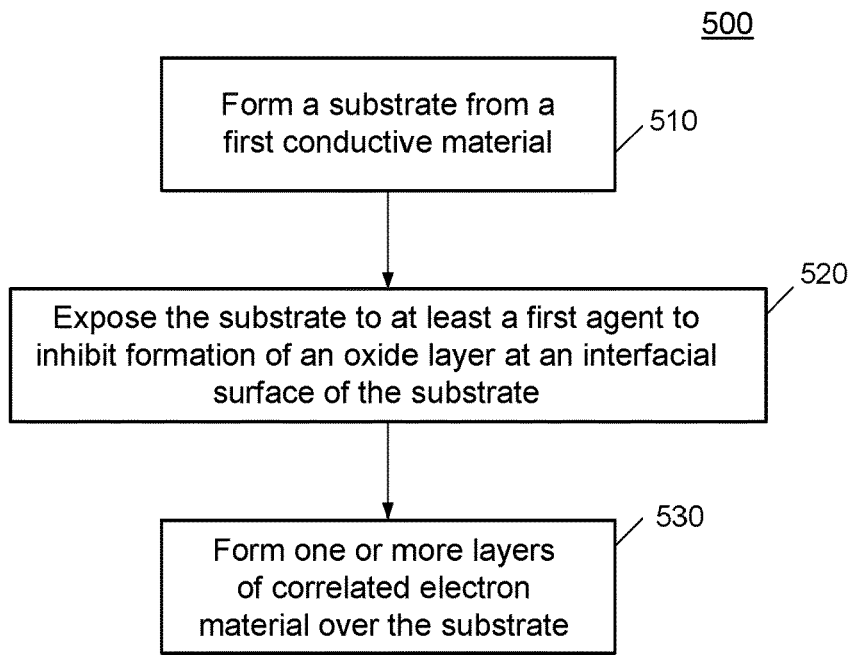
FIGS. 5-6 are flowcharts of embodiments for generalized processes for fabricating a correlated electron material with reduced interfacial layer impedance.

FIG. 5 is a flowchart of an embodiment 500 for a generalized process for fabricating correlated electron materials with reduced interfacial layer impedance. Example implementations, such as described in FIG. 5, and other figures described herein, may include blocks in addition to those shown and described, fewer blocks, or blocks occurring in an order different than may be identified, or any combination thereof. At block 510, a substrate, such as a conductive substrate comprising TiN may be formed. In other embodiments, a conductive substrate may comprise platinum, titanium, copper, aluminum, cobalt, nickel, tungsten, tungsten nitride, cobalt silicide, ruthenium oxide, chromium, gold, palladium, indium tin oxide, tantalum, silver, iridium, or any combination thereof. A conductive substrate formed at block 510 may involve a variety of processes, such as atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like, utilized in fabrication of CEM devices.

At block 520, the substrate may be exposed to at least a first agent to inhibit or prevent oxidation at an interfacial surface of the substrate. Accordingly, in embodiments, oxidation at an interfacial surface of the substrate may be inhibited by annealing the conductive substrate in a nitrogen-rich gaseous environment. In another embodiment, one or more layers of a metal oxynitride (e.g., TiOxNy) may be grown over the conductive substrate, which may prevent formation of oxygen vacancies at an interfacial layer between a conductive substrate and a CEM. In another embodiment, introduction of additional nitrogen prior to completing the formation of a conductive substrate may prevent or inhibit formation of resistive oxides at an interfacial layer. The method may conclude at block 530, in which a one or more layers of a CEM film may be formed over the conductive substrate.

Figure 6:
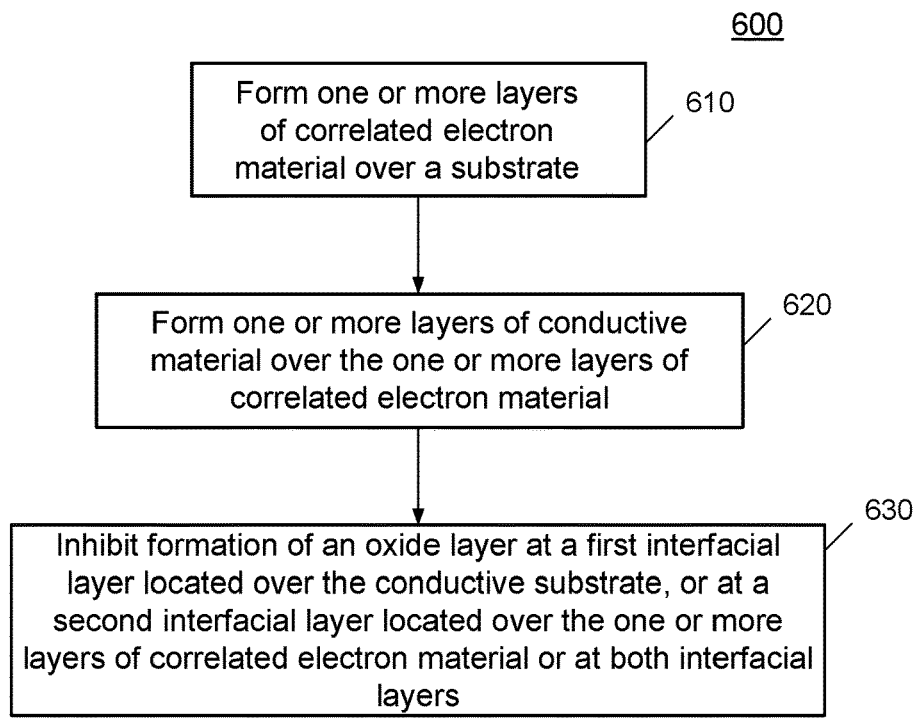

FIG. 6 is a flowchart of an embodiment 600 for a generalized process for fabricating correlated electron materials with reduced interfacial layer impedance. At block 610, one or more layers of CEM film may be formed over a substrate. In an embodiment, a CEM film may comprise one or more materials selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to an anion, such as oxygen, nitrogen, carbon, or other types of ligands), or combinations thereof, although claimed subject matter is not limited in scope in this respect. At block 620, one or more conductive materials may be formed over the one or more layers of correlated electron material. In embodiments, a conductive material may operate as an electrode comprising TiN, platinum, copper, aluminum, and so forth. Block 630 may involve reducing formation of an oxide layer at a first interfacial layer located over the conductive substrate or at a second interfacial layer located over the one or more layers of a CEM film (or at both interfacial layers). Reducing formation of an oxide layer may comprise annealing the conductive substrate, the CEM film, or both of the conductive substrate and the CEM film in a nitrogen-rich environment using, for example, $NH_3$, $N_2$, NO, or $N_2O$. The annealing process may include thermal annealing and or UV, direct or remote plasma, and/or hot wire energy sources to assist in incorporation of nitrogen or formation of the oxidation barrier material.

Figure 7:
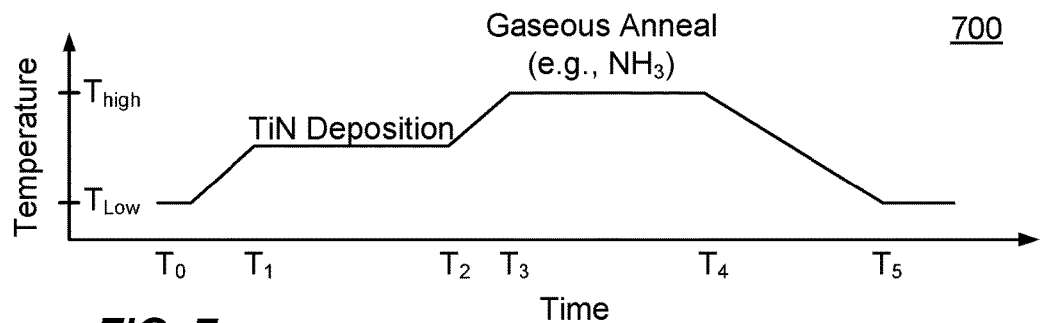
FIG. 7 is an illustration of an embodiment of a temperature profile, as a function of time, used in deposition and annealing processes for fabricating a conductive substrate.

FIG. 7 is an illustration of an embodiment 700 of a temperature profile, as a function of time, used in deposition and annealing processes for fabricating a conductive substrate. As shown in FIG. 7, temperature of a chamber, such as a chamber within which an atomic layer deposition process may proceed, may be increased from $T_{Low}$ to $T_{high}$ over a duration $T_0$ to $T_1$. From $T_1$ to $T_2$, a conductive film may be deposited upon an appropriate substrate utilizing an atomic layer deposition process, for example. In other embodiments the deposition method occurring from $T_1$ to $T_2$ may comprise chemical vapor deposition, physical vapor deposition, sputter, plasma enhanced chemical vapor deposition, gas cluster ion beam, or other methods of deposition or combinations of deposition methods, such as a combination of ALD and CVD to form a conductive substrate. In embodiments, time period $T_1$ to $T_2$ may comprise any duration that may be suitable for depositing a titanium nitride substrate having a thickness of, for example, approximately 5.0 nm to approximately 300.0 nm, although claimed subject is intended to embrace substrates having any appropriate thickness.

After deposition of a conductive substrate, an annealing period may follow. In some embodiments, annealing may take place at a temperature range greater than a temperature at which TiN is deposited. Annealing may be performed in a gaseous environment comprising ammonia ($NH_3$) utilizing a temperature approximately in the range of 20.0° C. to 900.0° C., and occur from time $T_3$ to time $T_4$. However, in particular embodiments, smaller ranges may be utilized, such as temperature ranges approximately in the range of 100.0° C. to 800.0° C. Further, for particular materials, even smaller temperature ranges may be utilized, such as from approximately 200.0° C. to approximately 600.0° C. Annealing durations, such as from time $T_3$-$T_4$, may range from approximately 1.0 second to approximately 5.0 hours, but may be narrowed to, for example, durations of approximately 0.5 minutes to 180.0 minutes. It should be noted that claimed subject matter is not limited to any particular temperature ranges for annealing of a conductive substrate, nor is claimed subject matter limited to any particular durations of annealing. In embodiments, annealing may be performed in a gaseous environment comprising one or more of gaseous nitrogen ($N_2$), ammonia ($NH_3$), ethylene diamine ($C_2H_8N_2$), or members of a nitrogen oxide family ($N_xO_y$), such as nitric oxide (NO), nitrous oxide ($N_2O$), nitrogen dioxide ($NO_2$), or any combination thereof.

Figure 8:
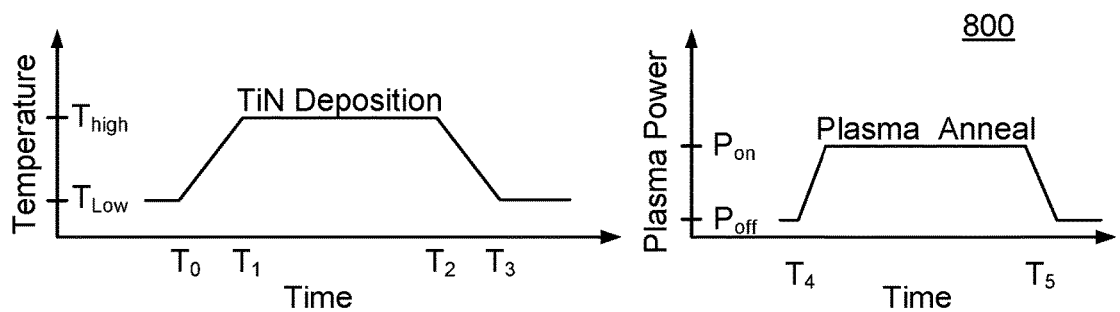
FIG. 8 is an illustration of an embodiment of a temperature and a plasma power profile, as a function of time, used in deposition and annealing processes for fabricating a correlated electron material device.

FIG. 8 is an illustration of an embodiment 800 of a temperature and a plasma power profile, as a function of time, used in deposition and annealing processes for fabricating correlated electron material devices. In a manner similar to that described with reference to FIG. 4, a conductive substrate may be formed utilizing an atomic layer deposition process, for example. In other embodiments the deposition method occurring from $T_1$ to $T_2$ may comprise chemical vapor deposition, physical vapor deposition, sputter, plasma enhanced chemical vapor deposition or other methods of deposition or combinations of deposition methods, such as a combination of ALD and CVD to form a conductive substrate.

After formation of a conductive substrate, the substrate may be annealed utilizing a plasma-enhanced chemical vapor deposition (PECVD). In embodiments, a PECVD process may give rise to ionization of nitrogen ($N_2$), ammonia ($NH_3$), ethylene diamine ($C_2H_8N_2$), or members of a nitrogen oxide family ($N_xO_y$), such as nitric oxide (NO), nitrous oxide ($N_2O$), nitrogen dioxide ($NO_2$), just to name a few examples. In particular embodiments, advantages of PECVD may comprise annealing of a conductive substrate in a nitrogen-rich gaseous environment but at a lower temperature range than higher temperature annealing described with reference to FIG. 4. Use of PECVD may provide other benefits, and claimed subject matter is not limited in this respect.

In particular embodiments, the annealing profiles of FIGS. 7 and 8 are not exclusive of one another. Thus, in some embodiments, a conductive substrate may be annealed utilizing a combination of thermal annealing in which, for example, a conductive substrate is exposed to gaseous ammonia at an elevated temperature prior to utilizing a PECVD process. In other embodiments, a conductive substrate may be annealed utilizing a PECVD process prior to additional annealing comprising exposure of the conductive substrate to gaseous nitrogen at an increased temperature, such as ammonia, for example. In certain embodiments, an annealing process may be interleaved with time periods during which a conductive substrate may be exposed to gaseous nitrogen at an elevated temperature as well as time periods during which the conductive substrate is exposed to a stream of ionic nitrogen, such as during a PECVD process, for example.

Figure 9:
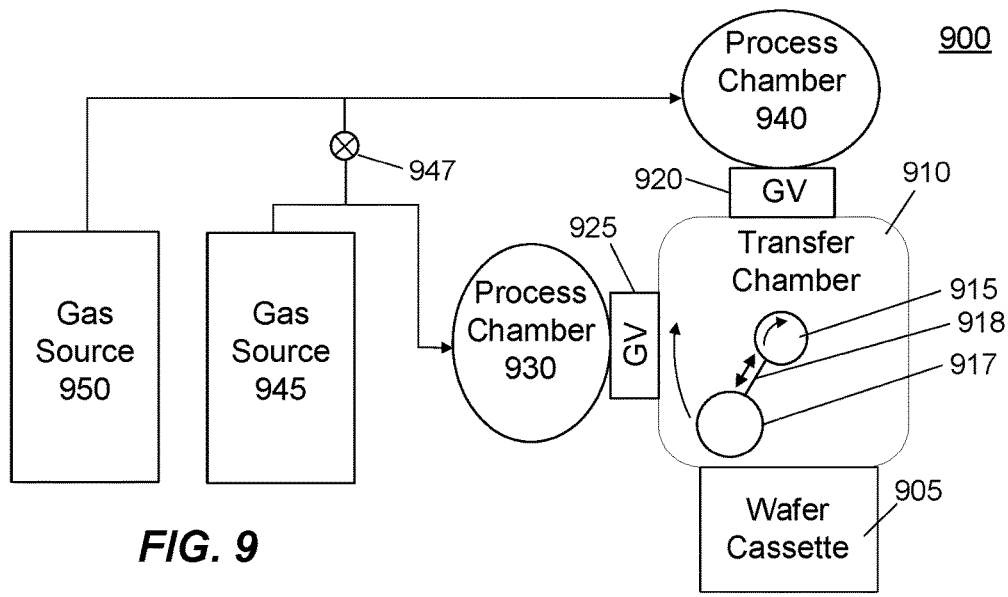
FIG. 9 is an illustration of an embodiment of a cluster tool implemented to fabricate a correlated electron material device with reduced interfacial layer impedance.

FIG. 9 is an illustration of an embodiment 900 of a cluster tool implemented to fabricate a correlated electron material device with reduced interfacial layer impedance. Although the cluster tool of FIG. 9 may be utilized to perform various deposition and annealing processes described herein, deposition and annealing processes may employ other types of equipment, and claimed subject matter is not limited in this respect. Additionally, although FIG. 9 indicates two gas sources, such as gas sources 945 and 950, embodiments may make use of a larger number of gas sources, such as three or more gas sources, for example, or may make use of a single gas source, for example. Further, although process chambers may be described as permitting such processes as atomic layer deposition, for example, process chambers of a cluster tool may permit other fabrication and/or fabrication-related processes such as chemical vapor deposition, physical vapor deposition, sputter, plasma enhanced chemical vapor deposition, spin on deposition, and/or other methods of deposition or combinations of deposition methods, such as a combination of ALD and CVD to form conductive substrate, CEM, and conductive materials deposited over a CEM.

In particular embodiments, wafer cassette 905 may enable one or more wafers, such as wafer 917, to be loaded into transfer chamber 910 to undergo processing to fabricate CEM switches, for example, on or over wafer 917. To bring about fabrication and annealing of a CEM switch, such as the CEM switch device of the embodiment of FIG. 2A, the cluster tool of embodiment 900 may include carousel 915, which may be equipped with extendable/retractable arm 918. Thus, extendable/retractable arm 918 may allow wafer 917, for example, to be conveniently transported from wafer cassette 905 into transfer chamber 910, which may comprise a vacuum or other type of inert or nonreactive gaseous environment. After retracting wafer 917 from wafer cassette 905, wafer 917 may be inserted into process chamber 930 and/or process chamber 940 and returned to wafer cassette 905 responsive to completion of, for example, fabrication of CEM switches on or over wafer 917. In embodiments, prior to insertion of wafer 917 into process chambers 930 and/or 940, gate valves 920 and/or 925 may be opened to permit wafer 917 to enter the process chamber and closed to permit a process chamber to be evacuated or to be filled with precursor gases, annealing gases, plasma phase substances, etc., without a significant amount of such gaseous/plasma phase substances escaping into transfer chamber 910. Gate valves 920 and/or 925 may provide additional capabilities, and claimed subject matter is not limited in this respect.

In a particular embodiment, in which a conductive substrate (e.g., conductive substrate 260 of FIG. 2A) is to be annealed in a nitrogen-rich environment, wafer 917 may be processed utilizing process chamber 940. Gas source 950 may represent, for example, gas sources for gases involved in atomic layer deposition, for example, of a titanium nitride substrate. Responsive to completion of formation of layers of a TiN substrate, wafer 917 may be withdrawn from a process chamber 940 and inserted into process chamber 930. Gate valve 925 may be closed to permit process chamber to be utilized for annealing utilizing, for example, gaseous ammonia. In other embodiments, however, process chamber 930 may be utilized to perform other annealing processes, such as plasma-based annealing processes, for example.

In another embodiment, the process chamber 940 may be utilized to form a TiN substrate. Accordingly, gas source 950 may represent a source for a number of gases utilized in a chemical vapor deposition or atomic layer deposition process, such as $TiCl_4$ and/or additional precursor gases. Gas source 945 may represent a source of a nitrogen-rich gas, such as $NH_3$, for example. In an embodiment, prior to completion of a TiN substrate within process chamber 940, for example, the TiN substrate may be exposed to a gaseous environment comprising $TiCl_4$ and $NH_3$. To bring about exposure of wafer 917 to $NH_3$, for example, valve 947 may be opened, which may allow $NH_3$ to flow from gas source 945 to process chamber 940.

In another embodiment, the process chamber 940 may be utilized to form a TiN substrate via a sputter deposition process using either a TiN target or a titanium target+ reactive sputter with $N_2$ and/or $NH_3$. In embodiments, $NH_3$ may flow into the process chamber 940 before and/or after TiN deposition to add nitrogen. Thus, gas source 950 may represent a source of $N_2$ and/or $NH_3$, used in a sputter deposition process. In particular embodiments, nitrogen may flow to process chamber 940 at an elevated temperature, such as $T_{high}$ as shown in FIG. 4, for example. In another embodiment, nitrogen may flow to process chamber 940 at a reduced temperature, such as described in reference to plasma annealing as shown in FIG. 5, for example. In an embodiment, if process chamber 940 is used in a titanium target+reactive sputter process, gas source 945 may comprise an argon gas source, which may flow to process chamber 940 responsive to opening of valve 915. In another embodiment, gas source 945 may comprise an oxynitride gas, such as nitric oxide (NO).

In an embodiment, CEM devices may be implemented in any of a wide range of integrated circuit types. For example, numerous CEM devices may be implemented in an integrated circuit to form a programmable memory array, for example, that may be reconfigured by changing impedance states for one or more CEM devices, in an embodiment. In another embodiment, programmable CEM devices may be utilized as a non-volatile memory array, for example. Of course, claimed subject matter is not limited in scope to the specific examples provided herein.

A plurality of CEM devices may be formed to bring about integrated circuit devices, which may include, for example, a first correlated electron device having a first correlated electron material and a second correlated electron device having a second correlated electron material, wherein the first and second correlated electron materials may comprise substantially dissimilar impedance characteristics that differ from one another. Also, in an embodiment, a first CEM device and a second CEM device, comprising impedance characteristics that differ from one another, may be formed within a particular layer of an integrated circuit. Further, in an embodiment, forming the first and second CEM devices within a particular layer of an integrated circuit may include forming the CEM devices at least in part by selective epitaxial deposition. In another embodiment, the first and second CEM devices within a particular layer of the integrated circuit may be formed at least in part by ion implantation, such as to alter impedance characteristics for the first and/or second CEM devices, for example.

Also, in an embodiment, two or more CEM devices may be formed within a particular layer of an integrated circuit at least in part by atomic layer deposition of a correlated electron material. In a further embodiment, one or more of a plurality of correlated electron switch devices of a first correlated electron switch material and one or more of a plurality of correlated electron switch devices of a second correlated electron switch material may be formed, at least in part, by a combination of blanket deposition and selective epitaxial deposition. Additionally, in an embodiment, first and second access devices may be positioned substantially adjacently to first and second CEM devices, respectively.

In a further embodiment, one or more of a plurality of CEM devices may be individually positioned within an integrated circuit at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective CEM devices, in an embodiment.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:

1. A method of constructing a switching device, comprising:
   forming a substrate from a first conductive material;
   exposing the substrate to at least a first agent to inhibit formation of an oxide layer on a first interfacial surface of the substrate; and
   forming one or more layers of electron back-donating bulk-switching correlated electron material over the substrate,
   wherein
   the exposing of the substrate to the at least the first agent comprises annealing the substrate in a gaseous environment comprising nitrogen while maintaining a conductivity of the first interfacial surface of the substrate.

2. The method of claim 1, further comprising:
   prior to formation of a second conductive material over the one or more layers of correlated electron material, exposing at least one layer of the one or more layers of correlated electron material to a second agent to inhibit formation of the oxide layer on a second interfacial surface between the at least one layer of the one or more layers of correlated electron material and the second conductive material; and
   wherein the gaseous environment comprises $NH_3$, $N_2$, NO or $N_2O$, or any combination thereof.

3. The method of claim 2, wherein the second agent comprises an oxygen barrier material deposited over a top layer of the one or more layers of correlated electron material.

4. The method of claim 3, wherein the second agent comprises gaseous ammonia, nitric oxide or nitrous oxide, or combinations thereof.

5. The method of claim 2, wherein the first conductive material and the second conductive material comprise substantially similar materials.

6. The method of claim 1, wherein the first conductive material comprises titanium nitride.

7. The method of claim 1, wherein exposing the substrate to at least the first agent comprises increasing the conductivity of the first interfacial surface of the substrate relative to one or more other layers of the substrate.

8. The method of claim 7, wherein the increasing of the conductivity of the first interfacial surface of the substrate relative to the one or more other layers of the substrate comprises forming an oxygen barrier layer over the substrate.

9. The method of claim 1, wherein the exposing the substrate to the at least a first agent brings about formation of one or more layers of $NiTiO_xN_y$ over the substrate.

10. The method of claim 1, wherein the forming of the one or more layers of correlated electron material comprises utilizing an atomic layer deposition process, a chemical vapor deposition process, a sputter deposition process or a spin on deposition process, or any combination thereof.

11. A method of fabricating a switching device, comprising:
    forming one or more layers of electron back-donating bulk-switching correlated electron material over a conductive substrate;
    forming one or more layers of conductive material over the one or more layers of correlated electron material; and
    inhibiting formation of an oxide layer, on a first interfacial layer disposed over the conductive substrate, while maintaining a conductivity of the first interfacial layer, or on a second interfacial layer disposed over the one or more layers of correlated electron material while maintaining a conductivity of the second interfacial layer, wherein
    the inhibiting of the formation of the oxide layer comprises annealing the conductive substrate, or the one or more layers of the correlated electron material, in a gaseous environment comprising nitrogen.

12. The method of claim 11, further comprising:
    increasing the conductivity of the first interfacial layer, or of the second interfacial layer or of the first interfacial layer and of the second interfacial layer, responsive to inhibiting the formation of the oxide layer, wherein the gaseous environment comprises $NH_3$, $N_2$, NO or $N_2O$, or any combination thereof.

* * * * *